United States Patent [19]

Ooshio et al.

[11] Patent Number: 4,600,492
[45] Date of Patent: Jul. 15, 1986

[54] MAGNET DRIVING METHOD AND DEVICE FOR SAME

[75] Inventors: Hirosuke Ooshio; Tetsuo Aikawa; Hidetaka Jo, all of Zama; Haruo Okano; Takashi Yamazaki, both of Kawasaki, all of Japan

[73] Assignees: Kabushiki Kaisha Tokuda Seisakusho, Zama; Kabushiki Kaisha Toshiba, Kawasaki, both of Japan

[21] Appl. No.: 758,505

[22] Filed: Jul. 24, 1985

[30] Foreign Application Priority Data

Jul. 25, 1984 [JP]  Japan ................................ 59-154577

[51] Int. Cl.⁴ ............................................. C23C 15/00
[52] U.S. Cl. .................................... 204/298; 156/345; 156/643; 204/192 E; 204/192 EC
[58] Field of Search ............ 204/298, 292 E, 292 EC; 156/345, 643

[56] References Cited

U.S. PATENT DOCUMENTS 4,309,266  1/1982  Nakamura et al. ................ 204/298
4,422,916 12/1983  McKelvey ......................... 204/298
4,426,264  1/1984  Münz et al. ....................... 204/298
4,431,473  2/1984  Okano et al. ...................... 156/345
4,444,635  4/1984  Kobayashi et al. ................ 204/298
4,498,969  2/1985  Ramachandran .................. 204/298
4,544,468 10/1985  Münz et al. ....................... 204/298
4,552,639 11/1985  Garrett .............................. 204/298

FOREIGN PATENT DOCUMENTS 53132482 11/1978  Japan ................................. 204/298
 5956580  2/1984  Japan ................................. 204/298

Primary Examiner—Arthur P. Demers
Attorney, Agent, or Firm—Schwartz, Jeffery, Schwaab, Mack, Blumenthal & Evans

[57] ABSTRACT

A plurality of bar-like magnets are arranged in a vacuum chamber at an equal space interval to form a plurality of strong magnetic fields in a stripe-pattern form and the magnets are moved reciprocally in the direction of arrangement of the magnetic fields while changing gradually the stop points of the magnets over a work to be processed by etching or sputtering in a step-like manner so that the integral effect of each magnetic field acting on the work is uniform over the entire region of the work.

9 Claims, 9 Drawing Figures

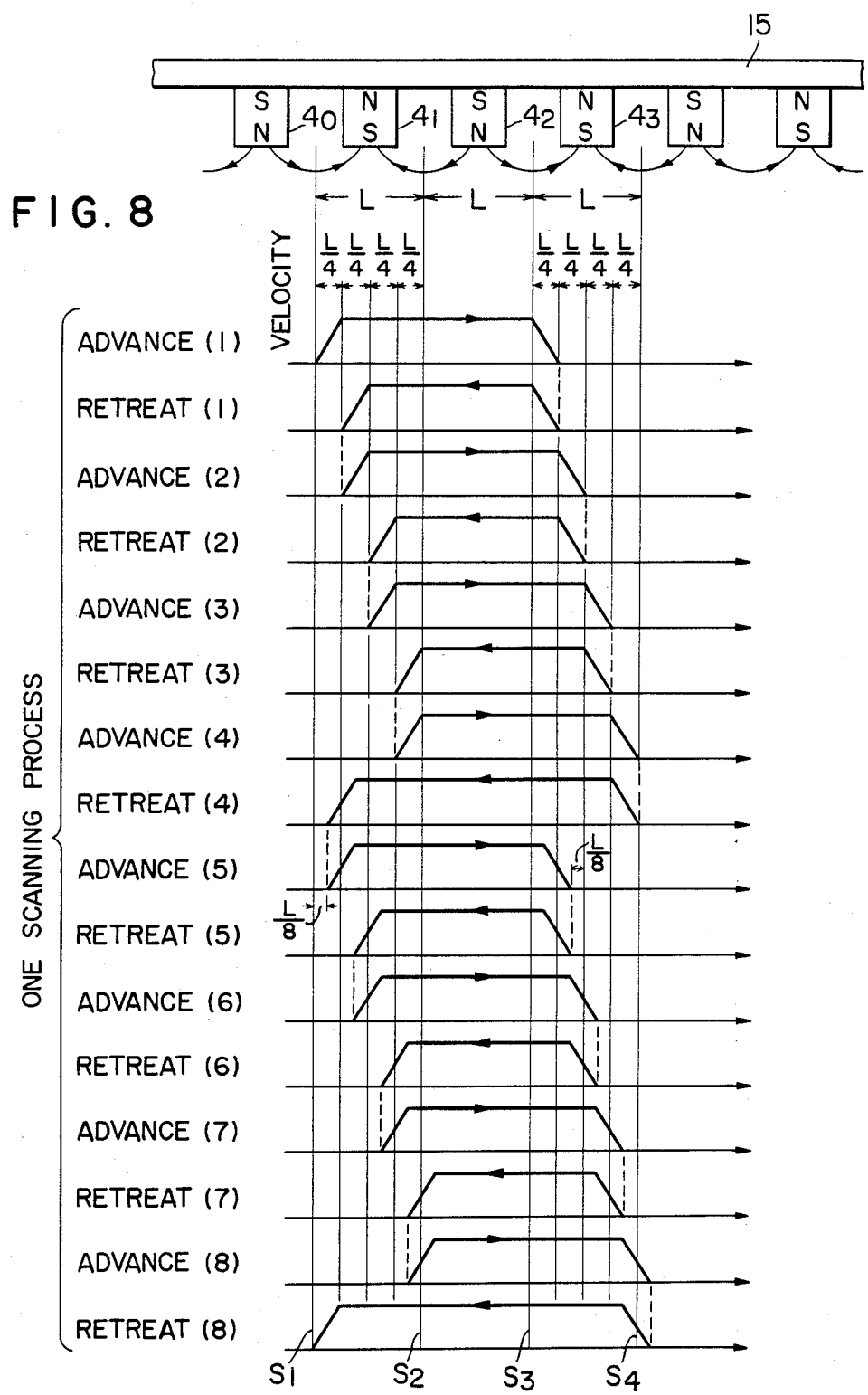

MAGNET DRIVING METHOD AND DEVICE FOR SAME

BACKGROUND OF THE INVENTION

The present invention relates to a magnet driving method for driving a plurality of magnets to provide a predetermined process for a work to be processed in a vacuum chamber, and to a device for same.

In general, as an equipment, provided with such a magnet driving device, there is a sputtering equipment as will as a dry etching equipment employed in the production of electronic elements or semiconductors.

In a conventional sputtering equipment, a target is placed on a target support plate having therein water-cooling pipes in a vacuum chamber. At the underside of the target support plate are disposed coaxially a plurality of magnets which are rotated eccentrically about an eccentric shaft. A plasma discharge is induced on the target by a magnetic field formed by the magnets.

However, in this conventional equipment, since the magnets are eccentrically rotated, the strength of the magnetic field is not uniform over the entire region of the target. Thus, in those areas of the target on which a strong magnetic field is generated, its material is sputtered, forming recesses, while in the remaining areas thereof where a weak magnetic field is generated, its material is left without sputtering. As a result, in the sputtering process, the material of the target is not uniformly spattered, thus confronting with disadvantages such that a failure to achieve an effective use of material raises the sputtering process cost.

Further, in a conventional dry etching equipment, a magnet in a slender form longer than the outer diameter of a wafer placed on an electrode in a vacuum chamber is moved forward and backward through a stroke beyond the outer diameter of the wafer.

In this dry etching equipment, a magnetic field of the magnet uniformly acts over the entirety of the wafer, thus permitting a uniform etching by a plasma discharge to be effected over the wafer.

However, in order that the magnetic field uniformly acts on the wafer, the magnet must be moved to opposite positions over a region of the wafer. While the magnet is positioned outside the wafer like above, the magnetic field does not act on the wafer. This inactive time period of the magnetic field is considerably long, thus resulting in a disadvantage that a long time is consumed for completion of the etching.

SUMMARY OF THE INVENTION

It is an object of the present invention to provide a magnet driving method and a device for same which permit magnetic fields to uniformly act over the entirety of a work to be processed ,and, besides, strong magnetic fields to act thereon to increase the processing speed as well as the process efficiency.

According to one aspect of this invention, there is provided a magnet driving method for moving magnets in a device in which a certain process is performed to a work while generating a plasma due to a magnetron discharge, which method comprises steps of: disposing the magnets in such a manner that a plurality of magnetic fields having almost the same magnetic field intensity are formed, at an equal interval, in a stripe-pattern form in a vacuum chamber of the device and that the magnetic fields are located in parallel over a region wider than the size of the work to be processed; and moving reciprocally the magnets in the direction of arrangement of the magnetic fields through a certain stroke while changing gradually the stop points of the magnets over the work in a step-like manner so that the integrated effect of the magnetic field at each position of the surface of the work becomes uniform after a predetermined period of time.

According to another aspect of this invention, there is provided a magnet driving device for moving magnets in a device in which a certain process is performed to a work while generating a plasma due to a magnetron discharge, which device comprises: a plurality of magnets disposed in such a manner that a plurality of magnetic fields having almost the same magnetic field intensity are formed at an equal interval in a stripe-pattern form and that the magnetic fields are located in parallel over a region wider than the size of the work to be processed; and a drive mechanism for moving reciprocally the magnets in the direction of arrangement of the magnetic fields through a certain stroke while changing gradually the stop points of the magnets over the work in a step-like manner so that the integrated effect of the magnetic field at each position of the surface of the work becomes uniform after a predetermined period of time.

The nature, utility, and further features of this invention will be more clearly apparent from the following detailed description with respect to preferred embodiments of the invention when read in conjunction with the accompanying drawings briefly described below.

BRIEF DESCRIPTION OF THE DRAWINGS

In the accompanying drawings

FIG. 8 is a diagram showing other reciprocal scan process of the magnets.

DETAILED DESCRIPTION OF THE PREFERRED EMBODIMENT

With reference to the drawings, hereinbelow there will be described in detail preferred embodiments of the present invention in a dry etching device.

Figure 1:
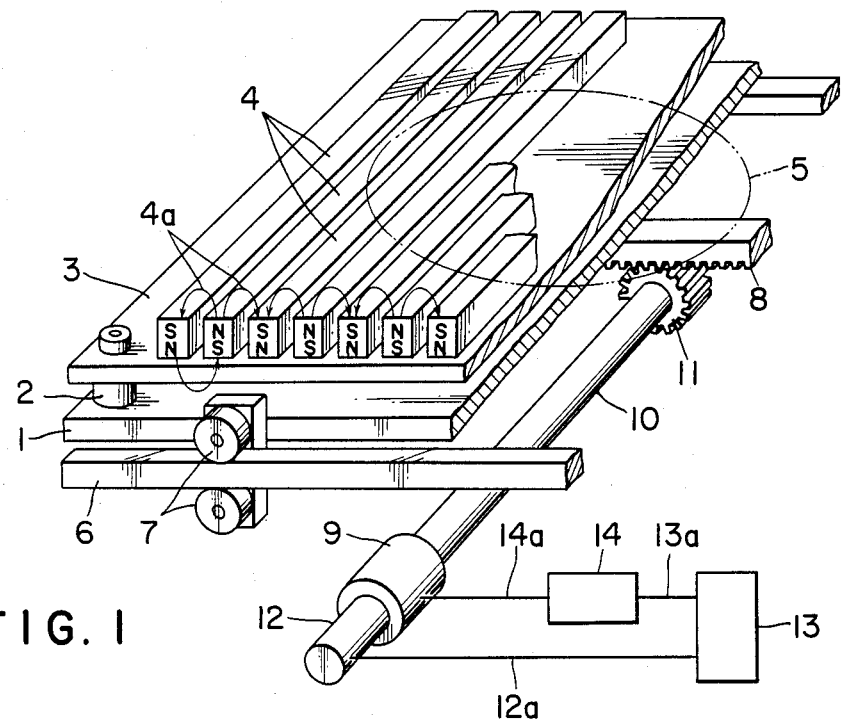
FIGS. 1 through 4 show a first embodiment of a magnet driving device according to the present invention, FIG. 1 being a partially cut-away perspective view of the magnet driving device, FIG. 2 being a side view of FIG. 1, FIG. 3 being a front view showing the relation between a transverse width of magnets and the size of a wafer, FIG. 4A being an explanatory diagram describing a reciprocal scan process of the magnets, and FIG. 4B being a flow chart showing the reciprocal scan process.
Figure 2:
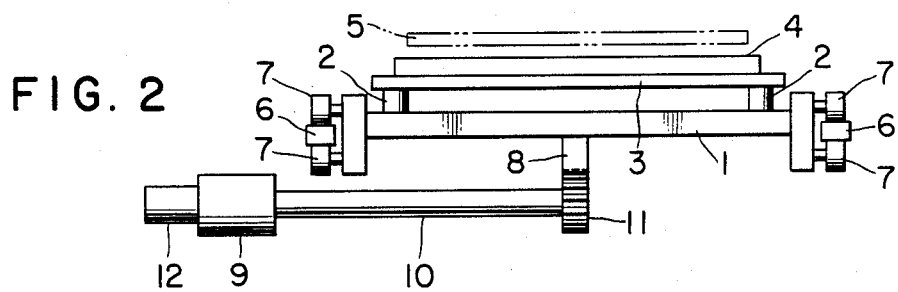

FIG. 1 is a perspective view of a first embodiment according to the invention, and FIG. 2, a right side view of FIG. 1.

Figure 3:
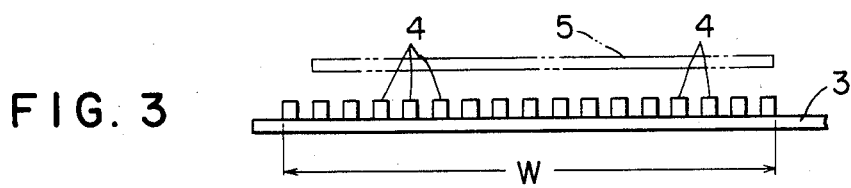

In this embodiment, to a lower base plate 1 is fixed an upper base plate 3, through a spacer 2, on which a plurality of bar-like magnets 4 having almost the same magnetic field intensity are fixed in parallel to one another. The length of each magnet 4 is longer than the outer diameter of a wafer 5, as shown in FIG. 2, and the number of the magnets is determined such that, as shown in FIG. 3, when disposed at intervals of a predetermined distance, magnets 4 have a total parallel arrangement width W (total transverse width) wider than the outer diameter (size) of the wafer 5. And adjacent two of magnets 4 are so arranged that the polarity of one magnet is reversed with respect to that of the adjacent magnet. In this arrangement of the magnets, a plurality of strong magnetic fields are generated in the intermediate positions of the respective adjacent magnets at an equal space interval so as to form a stripe-pattern. On a pair of rails 6,6 arranged parallel to the arrangement direction of magnets 4 (the direction towards the left and right in FIG. 1, that is, the transverse direction of magnets 4), the lower base plate 1 is placed to be carriable through rollers 7, 7.

To integrally reciprocate all magnets 4 together with lower and upper base plates 1, 3, the lower base plate 1 has an elongated rack 8 on its underside which is parallel to the arrangement direction of magnets 4. The rack 8 is meshed with a pinion 11 fixed to an output shaft 10 of a reversible direct-current motor 9. The direct-current motor 9 is provided with a rotary encoder 12 for detecting the angle of its rotation, the rotary encoder 12 being connected to a scanning control system 13 which receives a signal 12a from the encoder 12 and transmits a signal 13a for causing magnets 4 to perform a predetermined reciprocal scanning action. The scanning control system 13 is connected to a drive circuit 14 for converting the signal 13a therefrom into a drive signal 14a. This drive signal 14a is transmitted to the direct-current motor 9 thereby o rotate it forward and reversely as required. The reciprocal scanning of magnets 4 in this embodiment is performed as shown in FIGS. 4A and 4B. Namely, there are formed the stripes $S_1$, $S_2$ and $S_3$ of a great magnetic field intensity between adjacent magnets $4_0$, $4_1$; $4_1$, $4_2$; and $4_2$, $4_3$ at an equal space interval (pitch) L, respectively. Suppose that the pitch L is divided into five sections. When the base plate 3 is moved, the stripes $S_1$, $S_2$ and $S_3$ are moved together with the magnets. Each stripe (magnet 4) is moved by the scanning control system 13 in which a scanning process as shown in FIG. 4B is inputted.

Figure 4:
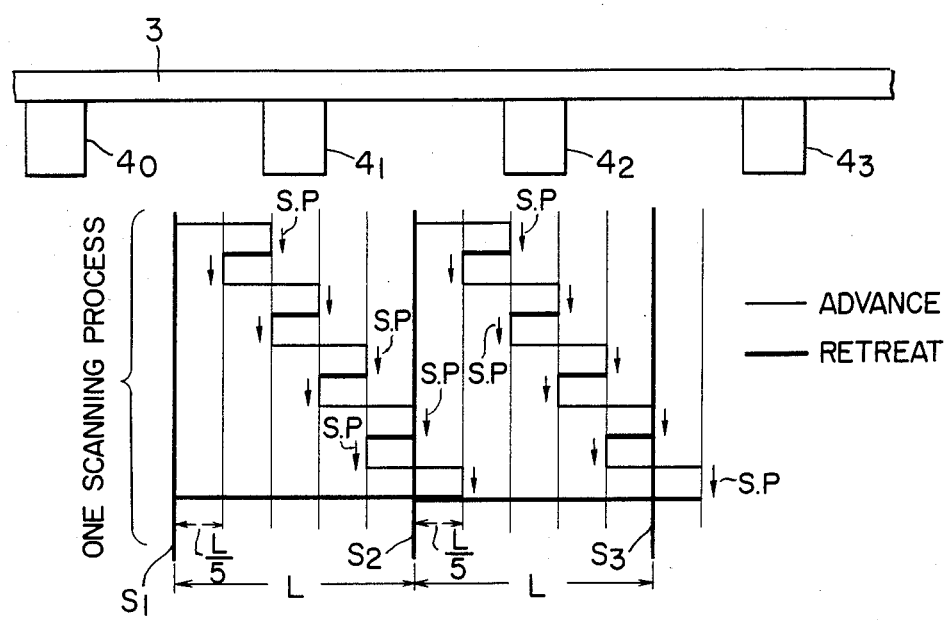
Figure 4:
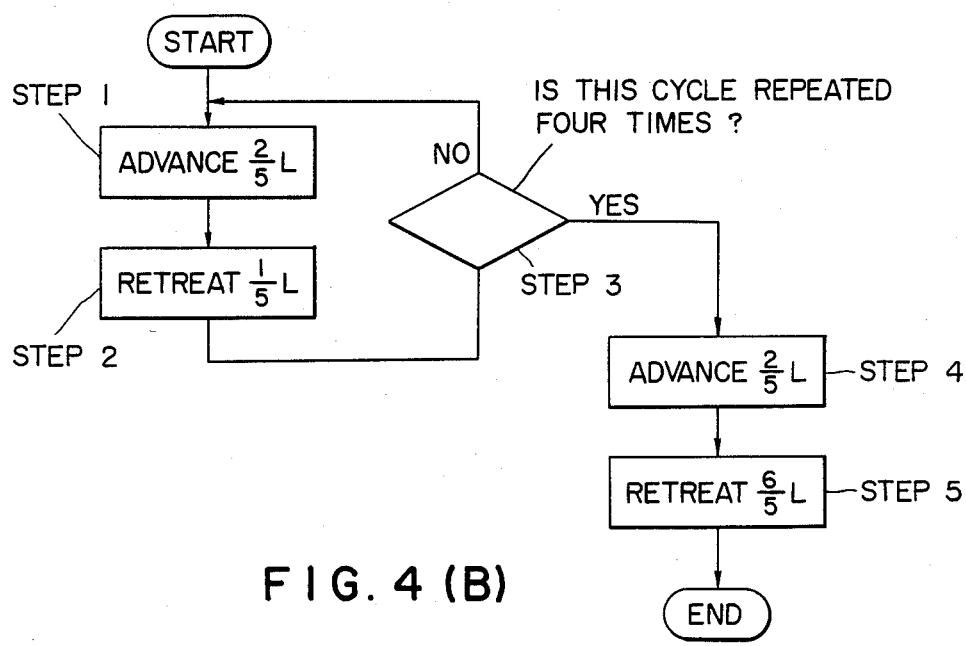

That is, first, the motor 9 is rotated in a direction so that the stripes $S_1$, $S_2$ and $S_3$ (the magnets 4) are advanced by a distance 2/5L in the right direction as viewed in FIG. 4 (step 1). Secondly, when the encoder 12 generates a predetermined number of pulses, the scanning control system 13 stops the motor 9 through the drive circuit and then rotates the motor 9 reversely so that the stripes $S_1$, $S_2$ and $S_3$ are retreated by a distance 1/5L (step 2).

Thereafter, these movements are repeated four times (step 3). After this repetition is completed, the stripes $S_1$, $S_2$ and $S_3$ are advanced by the distance 2/5L and then retreated by a distance 6/5L so that they are returned to their initial positions, respectively (steps 4 and 5). At this time, one scanning process is completed. This scanning process is then repeated for a predetermined period of time.

In general, when the magnets 4 are moved reciprocally through a distance, the magnetic fields of the magnets 4 act on a work to be processed for a long time when the magnets 4 are stopped. That is, when the magnets 4 are moved at a constant speed, the magnetic fields of the magnets 4 act on the work only for a short time. However, at stop points (S.P. in FIG. 4A) where the magnetic fields are stopped or at positions close to the stop points where the moving speed of the magnetic fields is decreased or increased, the work is influenced strongly by the magnetic fields.

In this embodiment, the advance distance within the size of the wafer 5 is determined to be different from the retreat distance so that the stop points where each magnetic stripe (field) is stopped are gradually moved forward by a distance 1/5L in a step-like manner. Accordingly, there are many stop points S.P. over the wafer and each stripe is stopped two times at a certain stop point S.P. during a single scanning process. As a result, the integrated effect of the magnetic field at every stop point S.P. on the wafer 5 becomes equal and, as a whole, the distribution of the magnetic fields acting on the wafer 5 becomes uniform. Thus, a favorable etching operation can be carried out on the wafer 5. In order to increase the process efficiency of the etching operation, the control system is adapted to control the angular velocity of the motor 9 by the provision of a tachogenerator (not shown).

Figure 5:
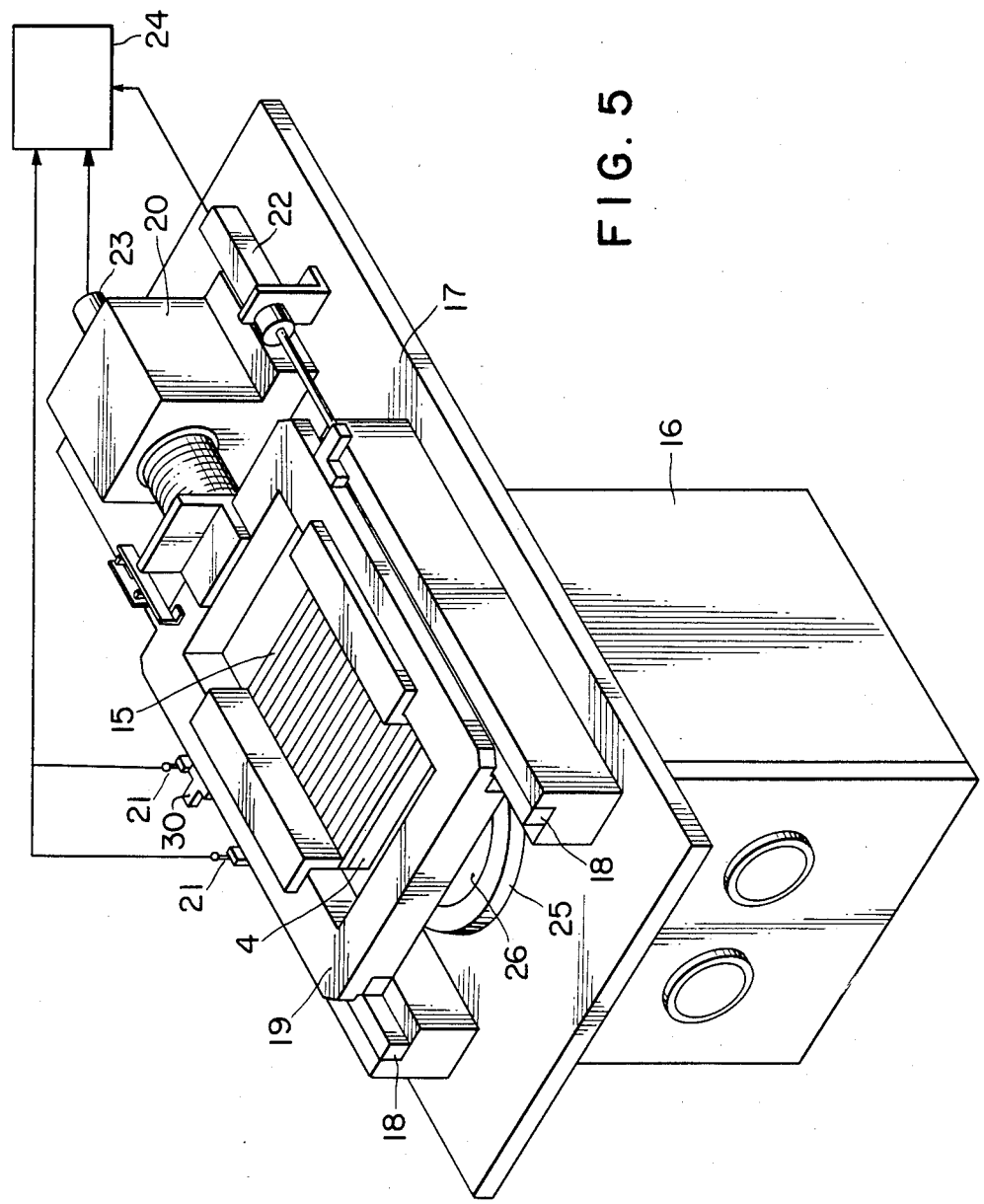
FIGS. 5 through 7 show a second embodiment of the present invention, FIG. 5 being a perspective view of the second embodiment, FIG. 6 being a front view, partly in section of the second embodiment and FIG. 7 being a diagram describing another reciprocal scan process of the magnets.
Figure 6:
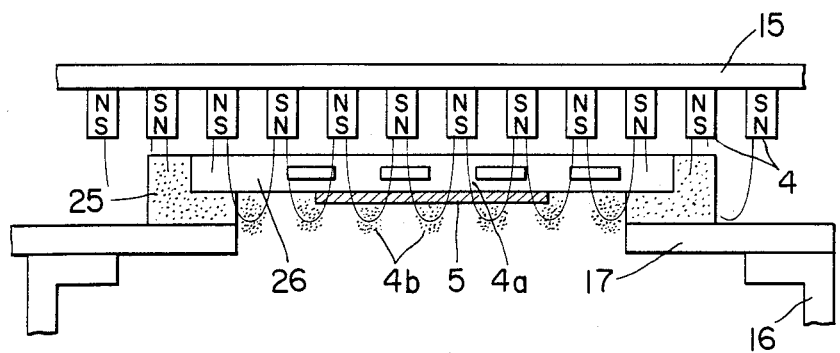
Figure 7:
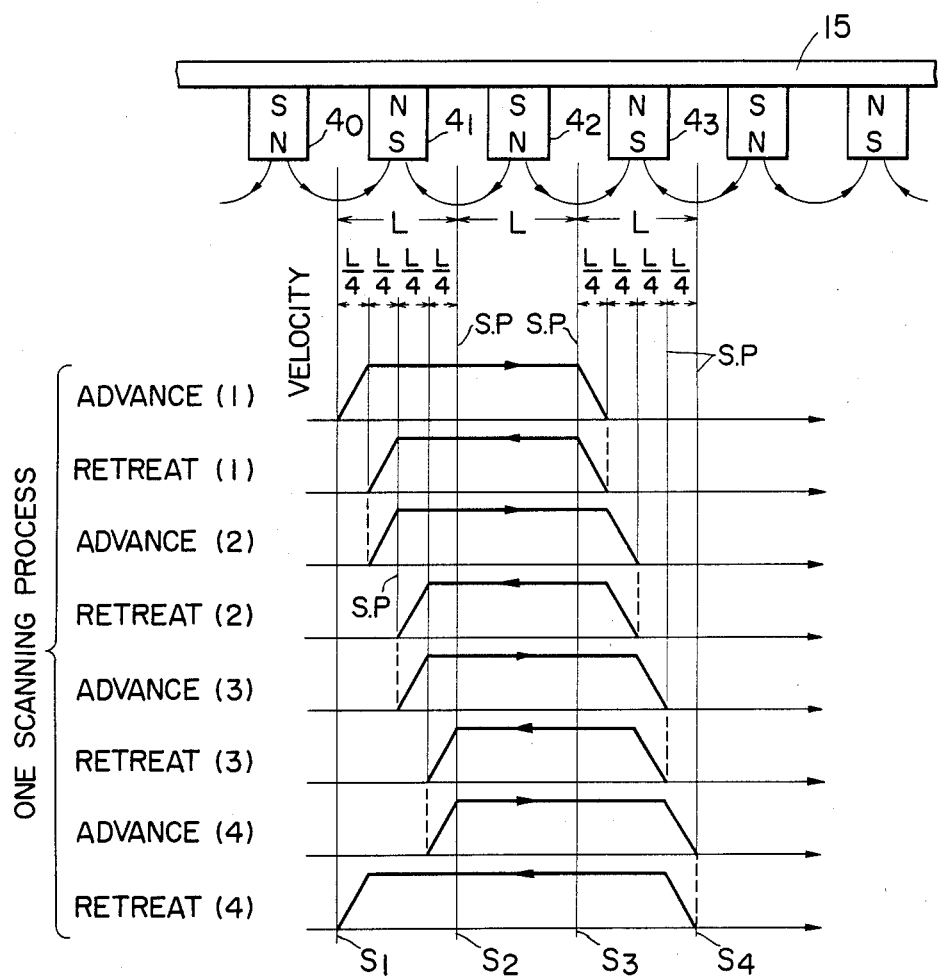

Further, in FIGS. 5 through 7, there is shown another embodiment of the invention. According to this embodiment, magnets 4 are provided on the underside of a base plate 15 and disposed above an insulating ring 25 and an electrode 26 placed on an etching chamber 16. To a top plate 17 of etching chamber 16 are fixed a pair of cross roller, guides 18, 18 which are arranged parallel to each other, between which is interposed a carrier frame 19 with the magnets 4 fitted therein. The carrier frame 19 is connected to a linear motor 20 so that the carrier frame 19 fitted to the magnets 4 is reciprocated along the cross roller guides 18. The carrier frame 19 is further provided with an actuating member 30 for cooperating with a pair of limit switches 21 in order to prevent the overrun of the reciprocating movements thereof. A linear scale 22 for measuring the distance of displacement of the frame 19 is also provided on the top plate 17. The limit switches 21 and the linear scale 22 as well as a tachogenerator 23 fitted to the linear motor 20 for controlling the speed of the motor 20 are connected to a control device 24, respectively. The magnets 4 generate a plurality of magnetic fields at an equal interval in a stripe-pattern form as shown in FIG. 6. A plurality of plasma regions 4b having a high density are formed on the respective surfaces of the wafer 5 and the electrode 26 due to a magnetron discharge in synchronism with the generation of the magnetic fields.

In this embodiment, the magnets 4 are adapted for a reciprocating scan as shown in FIG. 7. However, the magnets 4 may be adapted for the reciprocating scan shown in FIGS. 4A and 4B. In FIG. 7, the ordinate indicates the moving velocity of one (stripe $S_1$) of strong magnetic fields (stripes $S_1$, $S_2$, $S_3$ and $S_4$) while the abscissa indicates the positions of the stripe $S_1$ over the wafer 5. The other stripes $S_2$, $S_3$ and $S_4$ are moved in the same manner as the stripe $S_1$. Letting the pitch of interspaces of respective magnets 4 to be L and letting the pitch L to be divided equally into n sections, a travel distance D1 in the forward scanning of magnets 4 is given by the following expression:

$$D1 = mL + L/n$$

where $m \neq 0,1$, $n \neq 1$, $m=2$ and $n=4$ in this embodiment. The respective values of n and m are determined in accordance with the size of the wafer 5, the width of each of the magnetic field stripes and the uniformity of the integrated effect of the magnetic fields over the wafer 5. In FIG. 7, each magnet 4 is controlled to repeat three times a step of advancing by 2L+L/4 and retreating by 2L and to carry out a step of advancing by 2L+L/4 and retreating by 3L thereby to be returned to the original position. In this manner, one scanning process is performed.

A region between the two adjacent stripes $S_1$ and $S_2$ over the wafer 5 has three stop points S.P. where the stripe $S_1$ and a stripe (not shown) formed on the left side of the stripe $S_1$ as viewed in FIG. 7 stop. Further, a region between the two adjacent stripes $S_2$ and $S_3$ has also three stop points S.P. where the stripe $S_2$ and a stripe (not shown) located adjacent to the stripe $S_1$ on the left side of the stripe $S_1$ as viewed in FIG. 7 stop. A region between the two adjacent stripes $S_3$ and $S_4$ has also three stop points S.P. where the stripes $S_1$ and $S_3$ stop. A position over each stripe also forms a stop point S.P. That is, two strong magnetic fields act on each stop point. Accordingly, the stop points S.P. are located uniformly over the wafer 5 and the integrated effect of the magnetic fields at the respective stop points is equal to each other.

In order to make the magnetic fields act uniformly on the surface of the wafer 5, the magnets $4_0$, $4_1$, $4_2$ and $4_3$, that is, the stripes $S_1$, $S_2$, $S_3$ and $S_4$ must be moved at an equal acceleration in the respective regions close to the stop points as shown in FIG. 7.

FIG. 8 shows another scanning process similar to that of FIG. 7. In FIG. 8, the first half process is equal to that of FIG. 7 except its last step. That is, in the fourth retreat step (retreat (4)), the magnets 4 (stripes) are not returned to the initial position but returned to the points advanced by ¼L. Then, in the fifth advance step (advance (5)), each of the magnets 4 is moved forward to a position deviated by ¼L from the stop point of the first advance step (advance (1)). Thereafter, each magnet 4 is moved in the mode similar to that of the first half process as shown in FIG. 8. In this case, in the last step (retreat (8)), each magnet 4 is returned to its initial position. One scanning process shown in FIG. 8 comprises the first half process (advance (1) to retreat (4)) and the second half process (advance (5) to retreat (8)).

In this manner, if the stop points in the first half process are vaired from those in the second half process, respectively, the number of the stop points is increased. Accordingly, in this process, the magnetic fields act on the surface of the wafer 5 more uniformly than in the process shown in FIG. 7.

According to the present invention, since a plurality of magnetic fields act uniformly on the entire surface of a work to be processed, the unevenness of the magnetic fields can be avoided even if the intensity of the magnetic fields is very high. Thus, the processes such as sputtering, etching and the like can be reliably carried out and their processing speed and efficiency can be increased. Although, in the above embodiment, the magnets 4 are moved in the arrangement direction thereof, the magnets 4 may be moved obliquely with respect to the arrangement direction as far as the respective positions on the wafer 5 where the magnetic fields act are changed. The wording "the direction of arrangement of the magnetic field" in claims includes a concept of slanting direction with respect to "the direction of arrangement of the magnetic field".

In this specification, the wording "stop point" is used. However, it means a stop point at which the magnets 4 stop instantaneously when they change their moving direction.

Moreover in the second and third embodiments, the stroke of the magnets 4 is 2L+L/4. However, the stroke should be so restricted that the edge of the wafer is not located outside the outermost magnetic field when the magnets are moved.

What is claimed is:

1. A magnet driving method for moving magnets in a device in which a certain process is performed to a work while generating a plasma due to a magnetron discharge, which method comprises steps of:
   (a) disposing the magnets in such a manner that a plurality of magnetic fields having almost the same magnetic field intensity are formed, at an equal interval, in a stripe-pattern form in a vacuum chamber of the device and that the magnetic fields are located in parallel over a region wider than the size of the work to be processed; and
   (b) moving reciprocally the magnets in the direction of arrangement of the magnetic fields through a certain stroke while changing gradually the stop points of the magnets over the work in a step-like manner so that the integrated effect of the magnetic field at each position of the surface of the work becomes uniform after a predetermined period of time.

2. A magnet driving method according to claim 1, wherein the step of moving reciprocally the magnets comprises:
   (a) advancing each magnet for an advance distance shorter than a space interval between two adjoining magnets;
   (b) retreating each magnet to a stop point advanced for a predetermined distance from its former stop point;
   (c) repeating the above advancing step and retreating step alternately; and
   (d) returning the magnets to their respective initial positions after the above repeating step.

3. A magnet driving method according to claim 2, wherein each magnet is stopped at a plurality of stop points located at an equal interval between two strong adjoining magnetic fields formed by the magnets corresponding to the magnetic fields.

4. A magnet driving method according to claim 1, wherein the step of moving reciprocally the magnets comprises:
   (a) advancing each magnet for an advance distance longer than a space interval between two adjoining magnets;
   (b) retreating each magnet to a stop point advanced for a predetermined distance from its former stop point;
   (c) repreating the above advancing step and retreating step alternately; and
   (d) returning the magnets to their respective initial positions after the above repeating step.

5. A magnet driving method according to claim 4, wherein each magnet is stopped at a plurality of stop points located at an equal interval between two strong adjoining magnetic fields formed by the magnets corresponding to the magnetic fields.

6. A magnet driving method according to claim 1, wherein the step of moving reciprocally the magnets comprises:
   (a) advancing each magnet for a predetermined advance distance;
   (b) retreating each magnet to a stop point advanced from its former stop point for a predetermined distance determined in such a manner that the space interval between the two adjoining magnetic fields is divided equally into a predetermined number of sections;

(c) repeating the above advancing step and retreating step alternately until a certain strong magnetic field formed in an intermediate position between two adjoining magnetic fields is stopped at a stop point close to a strong magnetic field located adjacent to the above certain strong magnetic field;

(d) returning each magnet to a stop point advanced for a distance shorter than the predetermined distance for which the stop point of each magnet is advanced from the former stop point in the above advancing step;

(e) repeating the advancing step and the retreating step alternately the same times as that in the above repeating step; and (f) returning each magnet to the initial position.

7. A magnet driving device for moving magnets in a device in which a certain process is performed to a work while generating a plasma due to a magnetron discharge, which comprises:

(a) a plurality of magnets disposed in such a manner that a plurality of magnetic fields having almost the same magnetic field intensity are formed at an equal interval in a stripe-pattern form and that the magnetic fields are located in parallel over a region wider than the size of the work to be processed; and (b) a drive mechanism for moving reciprocally the magnets in the direction of arrangement of the magnetic fields through a certain stroke while changing gradually the stop points of the magnets over the work in a step-like manner so that the integrated effect of the magnetic field at each position of the surface of the work becomes uniform after a predetermined period of time.

8. A magnet driving device according to claim 7, wherein the drive mechanism comprises:

(a) a reversible motor for moving the magnets reciprocally;

(b) an encoder for detecting the rotation of the reversible motor;

(c) a tachogenerator for detecting the angular velocity of the motor; and (d) a control system for controlling the stop positions and the angular velocity of the motor.

9. A magnet driving device according to claim 7, wherein the drive mechanism comprises:

(a) a linear motor for moving the magnets reciprocally;

(b) a linear scale for detecting the position of the magnets;

(c) a tachogenerator for detecting the angular velocity of the motor; and (d) a control system for controlling the stop position and the velocity of the motor.

* * * * *